United States Patent
Yokokawa et al.

(10) Patent No.: US 8,074,156 B2
(45) Date of Patent: Dec. 6, 2011

(54) DECODING METHOD AND DECODING APPARATUS

(75) Inventors: Takashi Yokokawa, Kanagawa (JP); Makiko Yamamoto, Tokyo (JP); Takafumi Maehara, Tokyo (JP)

(73) Assignee: Sony Corporation, Tokyo (JP)

( * ) Notice: Subject to any disclaimer, the term of this patent is extended or adjusted under 35 U.S.C. 154(b) by 967 days.

(21) Appl. No.: 12/030,299

(22) Filed: Feb. 13, 2008

(65) Prior Publication Data

US 2008/0198953 A1 Aug. 21, 2008

(30) Foreign Application Priority Data

Feb. 16, 2007 (JP) ................ P2007-036424

(51) Int. Cl.
*H03M 13/03* (2006.01)
(52) U.S. Cl. .................................. 714/794
(58) Field of Classification Search .......... 714/746, 714/784, 786, 794
See application file for complete search history.

(56) References Cited

U.S. PATENT DOCUMENTS 6,634,007 B1 * 10/2003 Koetter et al. ............ 714/784
6,944,206 B1 * 9/2005 Dent ........................... 375/144

OTHER PUBLICATIONS

Jiang et al., Iterative soft input soft output deocding of Reed Solomon codes by adapting the parity check matrix, Aug. 2006, IEEE, p. 3746-3756.*
Kothiyal et al., Iterative Reliability based decoding of linear block codes with adaptive belief propagation, Dec. 2005, IEEE Comm. letters, vol. 9, No. 12, p. 1067-1069.*
V. Guruswami et al., Improve Decoding of Reed-Solomon and Algebraic-Geometry Codes, IEEE Transactions on information Theory, vol. 45, pp. 1757-1767, 1999.
R. Koetter et al., Algebraic Soft-Decision Decoding of Reed-Solomon Codes, IEEE Transactions on Information Theory, 2001.
R. Koetter et al., Efficient Interpolation and Factorization in Algebraic Soft-Decision Decoding of Reed-Solomon Codes, Proceedings of ISIT 2003.
D. MacKay et al., Error-Correcting Codes Based on Very Sparse Matrices, IEEE Transactions on Information Theory, 1999.
R. Berlekamp et al., On the Inherent Intractability of Certain Coding Problems, IEEE Transactions on Information Theory, vol. 24, pp. 384-386, May 1978.
Jin Jiang et al., Soft Decision Decoding of RS Codes Using Adaptive Parity Check Matrices, Proceeding of IEEE International Symposium on Information Theory 2004.

* cited by examiner

*Primary Examiner* — Shelly A Chase
(74) *Attorney, Agent, or Firm* — Finnegan, Henderson, Farabow, Garrett & Dunner, L.L.P.

(57) ABSTRACT

Disclosed herein is a decoding method of performing maximum a posteriori probability (MAP) decoding of selecting one decoded word from one or more decoded word candidates obtained by subjecting a linear code to iterative decoding by comparison of distances between a reception word and each decoded word candidate. A decoded word candidate in which a known value in a part of a transmission word has been changed to another value is excluded from the one or more decoded word candidates.

11 Claims, 6 Drawing Sheets

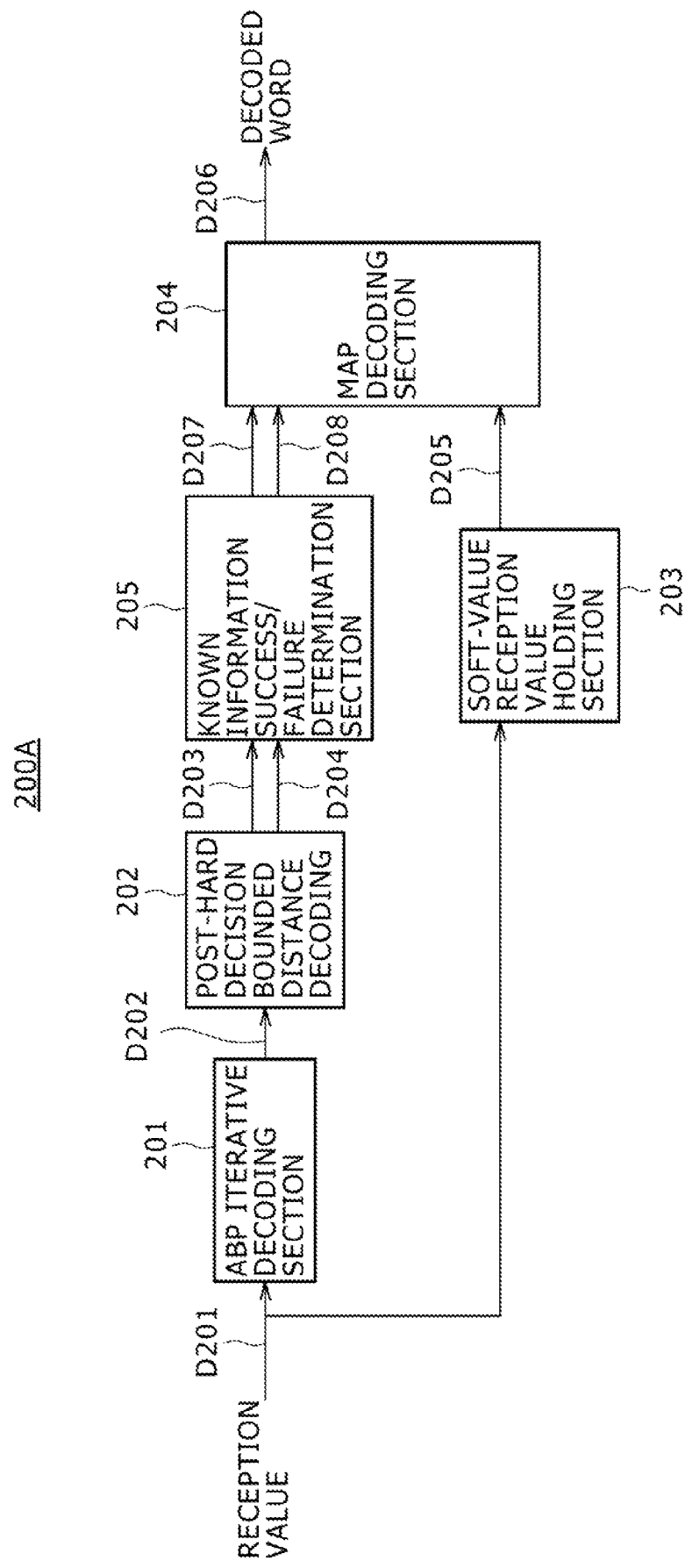

DECODING METHOD AND DECODING APPARATUS

CROSS REFERENCES TO RELATED APPLICATIONS

The present invention contains subject matter related to Japanese Patent Application JP 2007-036424 filed in the Japan Patent Office on Feb. 16, 2007, the entire contents of which being incorporated herein by reference.

BACKGROUND OF THE INVENTION

1. Field of the Invention

The present invention relates to a decoding method and a decoding apparatus that are applicable to a circuit and a program storage medium for achieving an error correction coding technology using an algebraic technique, for example.

2. Description of the Related Art

For algebraic geometric codes, such as Reed-Solomon codes and BCH codes, which are subfield subcodes of the Reed-Solomon codes, high-performance and low-computational cost decoding methods employing their algebraic properties are known.

Suppose, for example, that a Reed-Solomon code having a code length n, an information length k, a field of definition $GF(q)$ ($q=p^m$, p: a prime number), and a minimum distance $d=n-k$ is denoted as $RS(n, k)$. It is well known that minimum distance decoding (common decoding) of decoding a hard decision reception word into a codeword having a minimum Hamming distance guarantees correction of t ($t<d/2$) erroneous symbols.

Guruswami-Sudan list decoding (hereinafter referred to as "G-S list decoding") guarantees correction of t ($t<\sqrt{nk}$) erroneous symbols (see V. Guruswami and M. Sudan, Improved decoding of Reed-Solomon and Algebraic-Geometry codes, IEEE Transactions on Information Theory, vol. 45, pp. 1757-1767, 1999).

Koetter-Vardy list decoding (hereinafter referred to as "K-V list decoding"), which is an extended version of the Guruswami-Sudan list decoding and uses a soft decision reception word, is, as with the Guruswami-Sudan list decoding, made up of the following four steps: (1) calculation of reliability of each symbol from received information; (2) extraction of two-variable polynomial interpolation conditions from the reliability; (3) interpolation of two-variable polynomials; and (4) factorization of interpolation polynomials and creation of a list of decoded words. It is known that the K-V list decoding has higher performance compared to when hard decision decoding is applied (see R. Koetter and A. Vardy, Algebraic soft-decision decoding of Reed-Solomon codes, IEEE Transactions on Information Theory, 2001).

It is also known that computational cost thereof can be reduced to a practical level by re-encoding (see R. Koetter, J. Ma, A. Vardy, and A. Ahmed, Efficient Interpolation and Factorization in Algebraic Soft-Decision Decoding of Reed-Solomon codes, Proceedings of ISIT 2003).

As to linear codes, low-density parity-check codes (LDPC codes) capable of achieving high performance, nearly marginal performance, through iterative decoding using belief propagation (BP) have been recently attracting attention (see D. MacKay, Good Error-Correcting Codes Based on Very Sparse Matrices, IEEE Transactions on Information Theory, 1999).

It is theoretically known that the belief propagation (BP) used in the LDPC codes is generally effective only for linear codes having a low-density parity-check matrix. Also, it is known that reducing the density of a parity-check matrix of the Reed-Solomon codes or the BCH codes is NP-hard (see Berlekamp, R. McEliece, and H. van Tilborg, On the inherent intractability of certain coding problems, IEEE Transactions on Information Theory, vol. 24, pp. 384-386, May, 1978).

Thus, it has been considered difficult to apply the belief propagation (BP) to the Reed-Solomon codes or the BCH codes.

However, in 2004, Narayanan et al. suggested that application of the belief propagation (BP) to the Reed-Solomon codes, the BCH codes, or linear codes having a parity-check matrix that is not low in density using a parity-check matrix as diagonalized in accordance with the reliability of a reception word is effective (see Jing Jiang and K. R. Narayanan, Soft Decision Decoding of RS Codes Using Adaptive Parity Check Matrices, Proceeding of IEEE International Symposium on Information Theory 2004).

This technique is called adaptive belief propagation (ABP) decoding.

FIG. 1 is a flowchart illustrating ABP decoding proposed.

At step ST1, a reliability order of the reception word is investigated, and at step ST2, order conversion is performed.

At step ST3, a parity-check matrix is diagonalized in accordance with the converted order, and at step ST4, the belief propagation (BP) is performed using the resulting parity-check matrix.

Next, LLR is calculated at step ST5, a reliability order of the calculated LLR is investigated at step ST6, and decoding is performed at step ST7.

Thereafter, the above procedure is performed iteratively until iterative decoding termination conditions SC1 and SC2 are satisfied at steps ST8 and ST9.

When performing iterative decoding using the reliability updated by ABP, a list of decoded word candidates (i.e., candidates for a decoded word) obtained during the process is held, and one of the candidates that is closest to the reception word is finally selected, as the decoded word, from the list of the decoded word candidates. It is known that the probability of occurrence of a decoder error is thus reduced by ABP decoding, resulting in high decoding performance.

SUMMARY OF THE INVENTION

Known techniques involving use of ABP perform decoding using the reliability of the reception word, and even when a part of a transmission word is known, they do not employ that known information.

There is a possibility that when one decoded word is selected from the decoded word candidates, a decoded word in which a known value has been changed to another value, i.e., an erroneous decoded word, is selected from the decoded word candidates.

The present invention provides a decoding method and a decoding apparatus that are capable of preventing a decoded word candidate in which the known part is erroneous from being selected as the decoded word, and thus achieving high decoding performance.

According to one embodiment of the present invention, there is provided a decoding method of performing maximum a posteriori probability (MAP) decoding of selecting one decoded word from one or more decoded word candidates obtained by subjecting a linear code to iterative decoding by comparison of distances between a reception word and each decoded word candidate, wherein a decoded word candidate in which a known value in a part of a transmission word has been changed to another value is excluded from the one or more decoded word candidates.

According to another embodiment of the present invention, there is provided a decoding apparatus including: a candidate acquisition section configured to acquire one or more decoded word candidates obtained by subjecting a linear code to iterative decoding; and a decoding section configured to perform maximum a posteriori probability (MAP) decoding of selecting one decoded word from the one or more decoded word candidates by comparison of distances between a reception word and each decoded word candidate, wherein a decoded word candidate in which a known value in a part of a transmission word has been changed to another value is excluded from the one or more decoded word candidates.

According to the embodiments of the present invention, when a word transmitted is a codeword composed of a known value(s) and unknown value(s), the known information is used when decoding the received codeword, and thus, high decoding performance is achieved.

According to the embodiments of the present invention, by using the known information at the time of decoding, it is possible to prevent a decoded word candidate in which a known part is erroneous from being selected as the decoded word, and thus, high decoding performance is achieved.

BRIEF DESCRIPTION OF THE DRAWINGS

FIG. 6 shows a specific example in which a decoding method according to one embodiment of the present invention is applied to an ABP iterative decoder (circuit).

DETAILED DESCRIPTION OF THE PREFERRED EMBODIMENTS

Hereinafter, embodiments of the present invention will be described in conjunction with the accompanying drawings.

Figure 1:
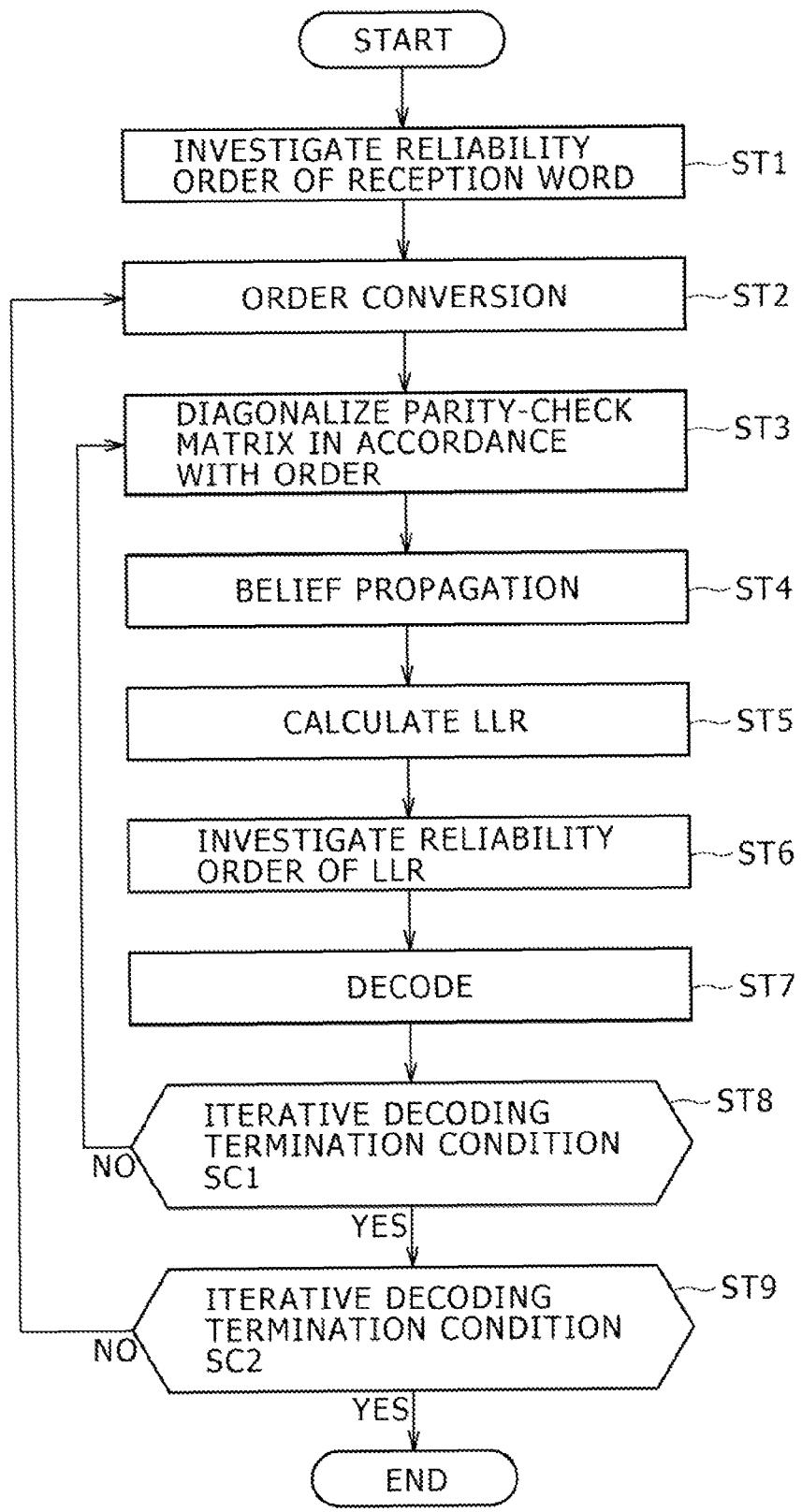
FIG. 1 is a flowchart illustrating ABP decoding proposed.
Figure 2:
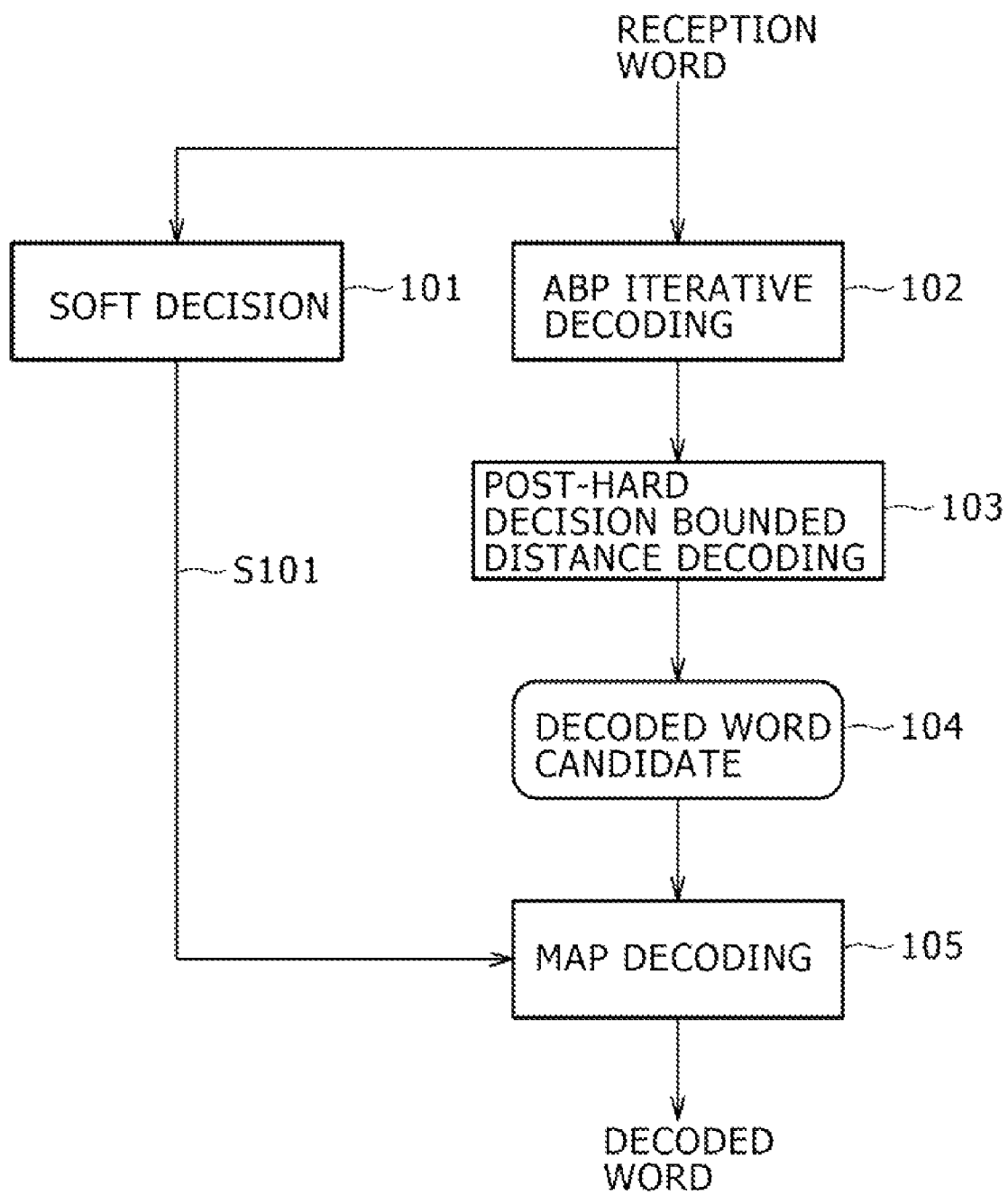
FIG. 2 is a block diagram illustrating an exemplary structure of a decoding apparatus that adopts a decoding method according to one embodiment of the present invention.

FIG. 2 is a block diagram illustrating an exemplary structure of a decoding apparatus 100 that adopts a decoding method according to one embodiment of the present invention.

In FIG. 2, the decoding apparatus 100 according to the present embodiment includes a soft decision section 101, an ABP iterative decoding section 102, a "post-hard decision bounded distance decoding section" 103, a decoded word candidate output section 104, and a MAP decoding section 105.

Note that in the present embodiment, the ABP iterative decoding section 102 and the post-hard decision bounded distance decoding section 103 combine to form a candidate acquisition section.

The decoding apparatus 100 according to the present embodiment has a capability to exclude, from decoded word candidates, a decoded word candidate in which a known value in a transmission word has been changed to another value.

The soft decision section 101 subjects a reception word (LLR) supplied to soft decision, and outputs a soft decision value S101 to the MAP decoding section 105.

The ABP iterative decoding section 102 is a device for decoding the reception word LLR supplied in accordance with a technique using adaptive belief propagation (ABP). The ABP iterative decoding section 102 accepts the reception word LLR as an input, and outputs LLR obtained by updating the reception word LLR to the post-hard decision bounded distance decoding section 103.

The post-hard decision bounded distance decoding section 103 subjects the LLR supplied to bounded distance decoding, and outputs a decoded word candidate to the MAP decoding section 105 via the decoded word candidate output section 104.

The MAP decoding section 105 performs MAP decoding using the decoded word candidate supplied and the soft decision value of the reception value, and selects one optimum decoded word and outputs the selected decoded word to the outside.

Figure 3:
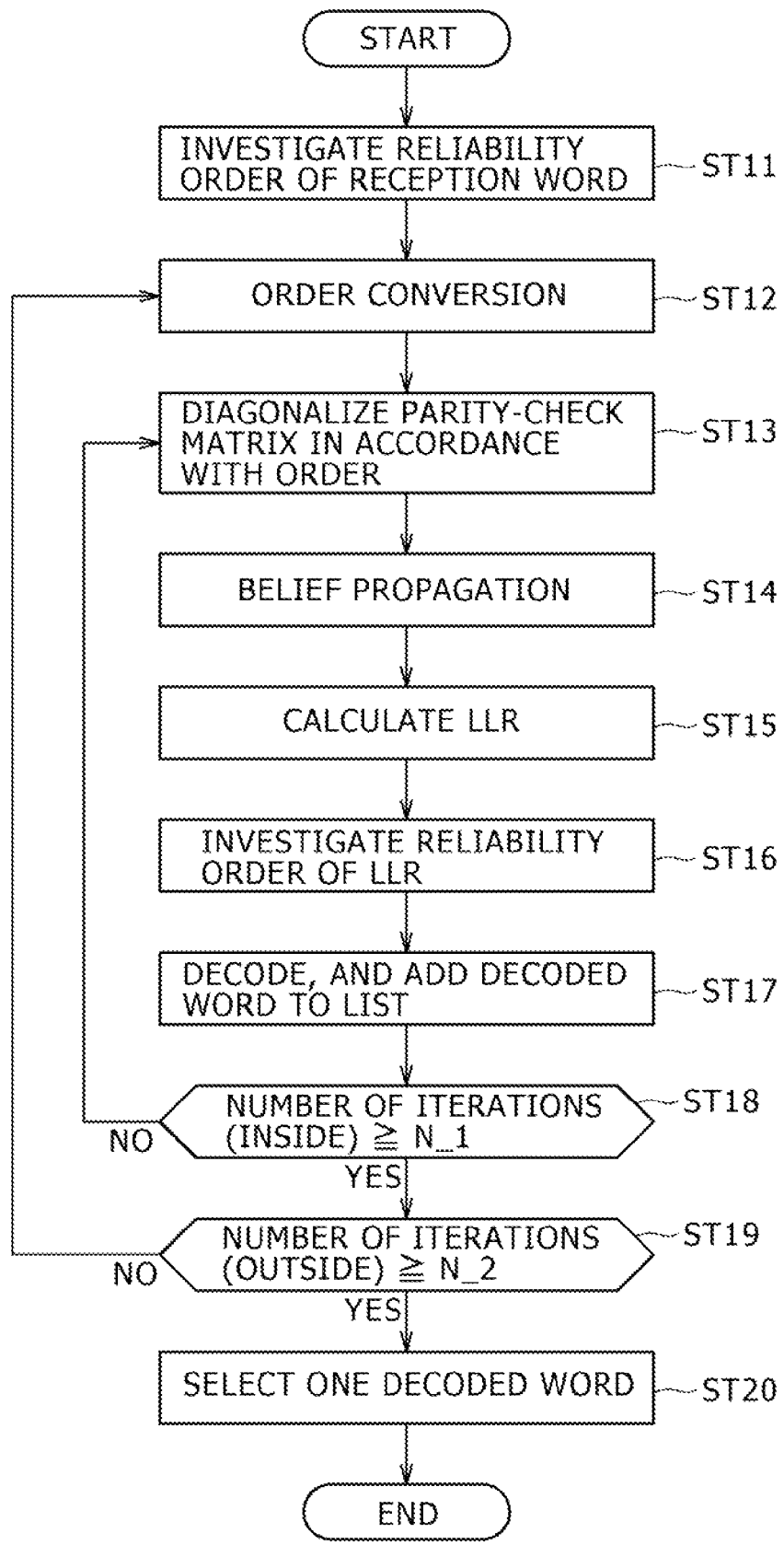
FIG. 3 is a flowchart illustrating a decoding procedure performed in the decoding apparatus according to the present embodiment.

A flow of a decoding procedure performed in the decoding apparatus 100 having the above structure will now be described below with reference to a flowchart of FIG. 3.

Here, specific examples are used as appropriate for the purpose of explanation. Specifically, $F_2^3$ is used as an example of a finite field, and a Reed-Solomon code RS(7,3) having a code length of 7 and an information length of 3 is used as an example of a linear code c.

Assume that a primitive root of $F_2^3$ is $\alpha$, a primitive polynomial thereof is $\alpha^3+\alpha+1=0$, and a code generator polynomial is $g(x):=(x+1)(x+\alpha)(x+\alpha^2)(x+\alpha^3)$. Then, a parity-check matrix H of C is given by an equation below.

$$H = \begin{pmatrix} 1 & 1 & 1 & 1 & 1 & 1 & 1 \\ 1 & \alpha & \alpha^2 & \alpha^3 & \alpha^4 & \alpha^5 & \alpha^6 \\ 1 & \alpha^2 & \alpha^4 & \alpha^6 & \alpha^8 & \alpha^{10} & \alpha^{12} \\ 1 & \alpha^3 & \alpha^6 & \alpha^9 & \alpha^{12} & \alpha^{15} & \alpha^{18} \end{pmatrix} \quad \text{[Equation 1]}$$

This is in the form of a 4×7 matrix.

Since $F_2^3$ is a cubic extension of $F_2$, the whole of the matrix can be expanded to four dimensions.

Actually, if the above parity-check matrix is expanded to three dimensions, an on-$F_2$ 12×21 matrix Hexp below is obtained.

$$H_{exp} = \begin{pmatrix} 100 & 100 & 100 & 100 & 100 & 100 & 100 \\ 010 & 010 & 010 & 010 & 010 & 010 & 010 \\ 001 & 001 & 001 & 001 & 001 & 001 & 001 \\ 100 & 010 & 101 & 110 & 111 & 011 & 001 \\ 010 & 101 & 110 & 111 & 011 & 001 & 100 \\ 001 & 100 & 010 & 101 & 110 & 111 & 011 \\ 100 & 101 & 111 & 001 & 010 & 110 & 011 \\ 010 & 110 & 011 & 100 & 101 & 111 & 001 \\ 001 & 010 & 110 & 011 & 100 & 101 & 111 \\ 100 & 110 & 001 & 101 & 011 & 010 & 111 \\ 010 & 111 & 100 & 110 & 001 & 101 & 011 \\ 001 & 101 & 011 & 010 & 111 & 100 & 110 \end{pmatrix} \quad \text{[Equation 2]}$$

A corresponding codeword is similarly expanded to on-$F_2$ 21 bits. Assume now that the expanded codeword is a codeword below.

$$c = (c_1, c_2, c_3, c_4, \ldots, c_{21}) \quad \text{[Equation 3]}$$
$$= (0, 1, 0, 1, 1, 0, 0, 0, 1, 1, 0, 0, 0, 0, 0, 1, 1, 0, 0, 0, 1)$$

Assume that this codeword was transmitted over an additive white Gaussian noise (AWGN) channel using BPSK modulation, and that, as a result, LLRy below was obtained.

$$y=(-1.54, 0.89, 0.25, -0.17, 2.49, -0.18, -1.31, -1.82,$$
$$2.25, 1.32, -2.69, -0.95, -1.55, -0.34, 1.26,$$
$$4.08, 3.28, -2.40, -1.71, -1.36, 3.79) \quad \text{[Equation 4]}$$

When such an LLR is supplied to the ABP iterative decoding section 102, decoding of a list of the decoded word candidates is started.

The ABP iterative decoding section 102 investigates a reliability order concerning the LLRy received (ST101), and orders received symbols in ascending order of reliability (ST102) as shown below.

[Equation 5]

$$y = (\overset{⑪}{-1.54}, \overset{⑤}{0.89}, \overset{③}{0.25}, \overset{①}{-0.17}, \overset{⑰}{2.49}, \overset{②}{-0.18}, \overset{⑧}{-1.31}, \overset{⑭}{-1.82}, \overset{⑮}{2.25}, \overset{⑨}{1.32}, \overset{⑬}{-2.69}, \overset{⑥}{-0.95},$$
$$\overset{⑫}{-1.55}, \overset{④}{-0.34}, \overset{⑦}{1.26}, \overset{㉑}{4.08}, \overset{⑲}{3.28}, \overset{⑯}{-2.40}, \overset{⑱}{-1.71}, \overset{⑩}{-1.36}, \overset{⑳}{3.79})$$

That is, an order of indices of rows to be diagonalized is as follows.

4,6,3,14,2,12,15,7,10,20,1,13,19,8,9,18,5,11,17,21,16

The parity-check matrix Hexp is diagonalized in the above order (ST103), and as a result, a matrix Hnew below is obtained.

$$H_{new} = \begin{pmatrix} 000 & 110 & 000 & 010 & 100 & 001 & 000 \\ 000 & 010 & 001 & 000 & 110 & 000 & 001 \\ 000 & 001 & 010 & 010 & 000 & 011 & 001 \\ 010 & 010 & 001 & 010 & 100 & 111 & 000 \\ 001 & 000 & 010 & 010 & 100 & 101 & 001 \\ 000 & 000 & 000 & 011 & 100 & 011 & 001 \\ 000 & 010 & 111 & 000 & 100 & 100 & 000 \\ 000 & 010 & 011 & 110 & 100 & 101 & 001 \\ 000 & 000 & 001 & 010 & 001 & 100 & 000 \\ 000 & 010 & 001 & 010 & 000 & 010 & 100 \\ 000 & 010 & 010 & 000 & 000 & 101 & 011 \\ 100 & 000 & 001 & 010 & 000 & 110 & 001 \end{pmatrix} \quad \text{[Equation 6]}$$

Using this parity-check matrix, belief propagation (BP) is performed once, for example (ST104). As a result, updated LLR is obtained (ST105 and ST106).

[Equation 7]

$$\Lambda^q = (\overset{⑭}{-1.68}, \overset{⑤}{0.83}, \overset{②}{0.19}, \overset{①}{-0.08}, \overset{⑯}{2.19}, \overset{④}{-0.28}, \overset{⑧}{-1.25}, \overset{⑬}{-1.65}, \overset{⑮}{2.03}, \overset{⑩}{1.27}, \overset{⑱}{-2.58}, \overset{⑥}{-1.04},$$
$$\overset{⑪}{-1.43}, \overset{③}{-0.25}, \overset{⑦}{1.09}, \overset{㉑}{3.93}, \overset{⑲}{3.31}, \overset{⑰}{-2.31}, \overset{⑫}{-1.59}, \overset{⑨}{-1.26}, \overset{⑳}{3.81})$$

The new LLR obtained is inputted to the subsequent post-hard decision bounded distance decoding section 103, and decoding is performed. Then, a decoded word candidate obtained is added to a decoded word list (ST107).

Meanwhile, using the degree of the reliability of the updated LLR, the ABP iterative decoding section 102 diagonalizes the parity-check matrix again.

Belief propagation (BP) is performed using the matrix diagonalized to update the LLR. The LLR updated is inputted to the subsequent post-hard decision bounded distance decoding section 103, and decoding is performed. Then, a decoded word candidate obtained is added to the decoded word list.

In this manner, the ABP and subsequent decoding are performed iteratively a predetermined number N1 of times (ST108), and decoded word candidates by a first iteration of outside iterative decoding are obtained.

Next, as an initial value of a diagonalization priority order of the parity-check matrix, a value different from that in the previous iteration is prepared. That is, while the initial value of the priority order for the first iteration of the outside iterative decoding was the ascending order of the reliability of the LLR of the reception value, the initial order is altered.

For example, indices of rows corresponding to bits having a low reliability in the LLR of the reception value are ordered as follows.

| 4,6,3,14,2,12,15 |, | 7,10,20,1,13,19,8 |, | 9,18,5,11,17,21,16 |

While diagonalization in the first iteration was performed in the above order, indices of 21/N2=21/3=7 rows are changed in order (ST109).

| 7,10,20,1,13,19,8 |, | 4,6,3,14,2,12,15 |, | 9,18,5,11,17,21,16 |

The parity-check matrix is diagonalized in accordance with this order, and belief propagation (BP) is performed. Updated LLR is inputted to the subsequent post-hard decision bounded distance decoding section 103, and a decoded word list is obtained.

In addition, with respect to the updated LLR, the parity-check matrix is subjected to diagonalization from rows corresponding to bits having lower reliabilities to rows corresponding to bits having higher reliabilities.

In the above-described manner, a second iteration of the outside iterative decoding is performed with the initial value of the order different from that of the first iteration of the outs-de iterative decoding. The belief propagation (BP) and the subsequent bounded distance decoding are performed iteratively the predetermined number N1 of times in the post-hard decision bounded distance decoding section 103, and a list of decoded word candidates is obtained.

For an initial value of the order for a third iteration, different seven bits are changed as shown below, and similar iterative decoding is performed to obtain decoded word candidates.

| 9,18,5,11,17,21,16 |, | 4,6,3,14,2,12,15 |, | 7,10,20,1,13,19,8 |

The outside iterative decoding is performed N2=3 times in accordance with the above procedure, so that a decoded word list is obtained. Based on the obtained decoded word list and the initially received LLR, one decoded word that is considered optimum is selected by MAP decoding in the MAP decoding section 105 (ST110), and the selected decoded word is outputted as the decoded word.

In a known method, a Euclidean distance between the received LLR, which is a soft value, and each of the decoded word candidates is calculated in the MAP decoding, and a decoded word candidate having the shortest Euclidean distance is selected as the decoded word.

In contrast, in the method according to the present embodiment, in the case where a certain part of the transmission word is a known value, a decoded word candidate in which the known value has been changed to another value, i.e., an erroneous decoded word, is excluded from the decoded word candidates and is not subjected to MAP decoding when the received transmission word is decoded, and one decoded word is selected from decoded word candidates in which the known value has been decoded correctly, and is determined to be the decoded word.

In the case of MPEG-2TS packets, for example, a value of a synchronization byte is specified as "0x47."

Suppose that the transmission word is an MPEG-2TS packet, and the MPEG-2TS packet is received and decoded. When selecting one decoded word from the decoded word candidates, a decoded word in which the value of the synchronization byte is different from "0x47" can be determined to be erroneous. Therefore, such an erroneous decoded word can be excluded from the decoded word candidates to achieve high decoding performance. This is also true with a case where "0xB8," which is an inverse of "0x47," is used as the value of the synchronization byte.

In the embodiment described above, the code to be decoded by the decoding apparatus is a Reed-Solomon code. It will be appreciated, however, that the code to be decoded is not limited to the Reed-Solomon code but may be a BCH code or other types of codes in accordance with other encoding schemes.

Also note that when decoding the LLRs obtained by the ABP iterative decoding to obtain the list of the decoded word candidates, K-V list decoding, soft-decision list decoding using a soft value as it is as an input, and so on are applicable as well as the bounded distance decoding after hard decision.

Figure 4:
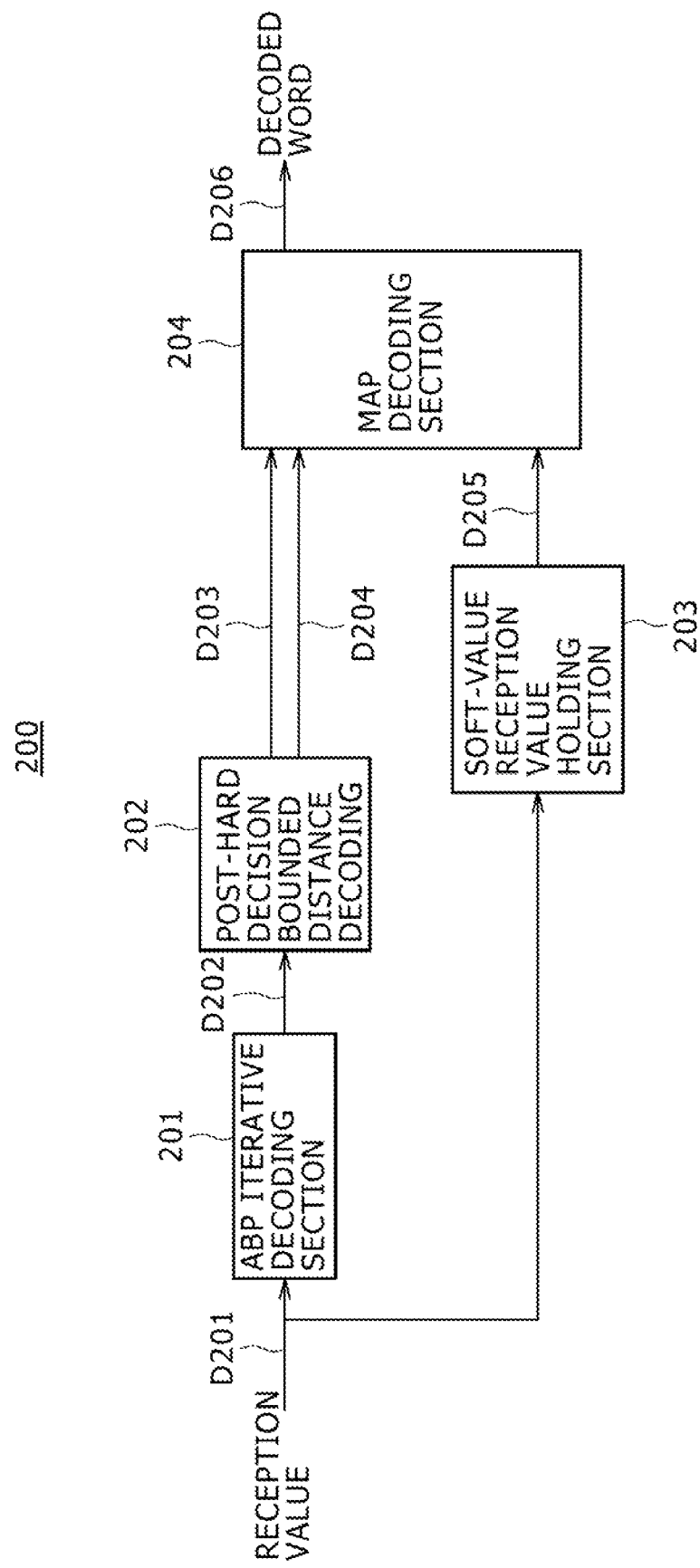
FIG. 4 shows a specific example in which a decoding method according to one embodiment of the present invention is applied to an ABP iterative decoder (circuit)

FIG. 4 shows a specific example in which the decoding method according to one embodiment of the present invention is applied to an ABP iterative decoder (circuit).

A decoding apparatus 200 includes an ABP iterative decoding section 201, a bounded distance decoding section 202, a soft-value reception value holding section 203, and a MAP decoding section 204.

The ABP iterative decoding section 201 is a device for decoding a reception word D201 received via a communications channel (not shown) in accordance with a technique using ABP. The ABP iterative decoding section 201 accepts the reception word D201 as an input, and outputs a plurality of LLRs D202 updated sequentially by iterative decoding.

The bounded distance decoding section 202 accepts, as an input, the LLR D202 supplied from the ABP iterative decoding section 201, and performs bounded distance decoding on the input subjected to hard decision. Then, the bounded distance decoding section 202 outputs a resulting bounded distance decoding result D203 and decoding success/failure D204.

The soft-value reception value holding section 203 accepts the reception word D201 as an input, and holds a result obtained by subjecting the input to soft decision until the decoded word candidate D203 is outputted. Then, the soft-value reception value holding section 203 outputs a soft-decided reception word D205 to the MAP decoding section 204 when MAP decoding is performed in conjunction with the decoded word candidate D203.

The MAP decoding section 204 accepts, as inputs, one or more decoded word candidates D203 and decoding success/failure D204 and the soft-decided reception word D205 supplied from the soft-value reception value holding section 203, and selects one decoded word D206 from the one or more decoded word candidates D203 and outputs the selected decoded word D206.

Figure 5:
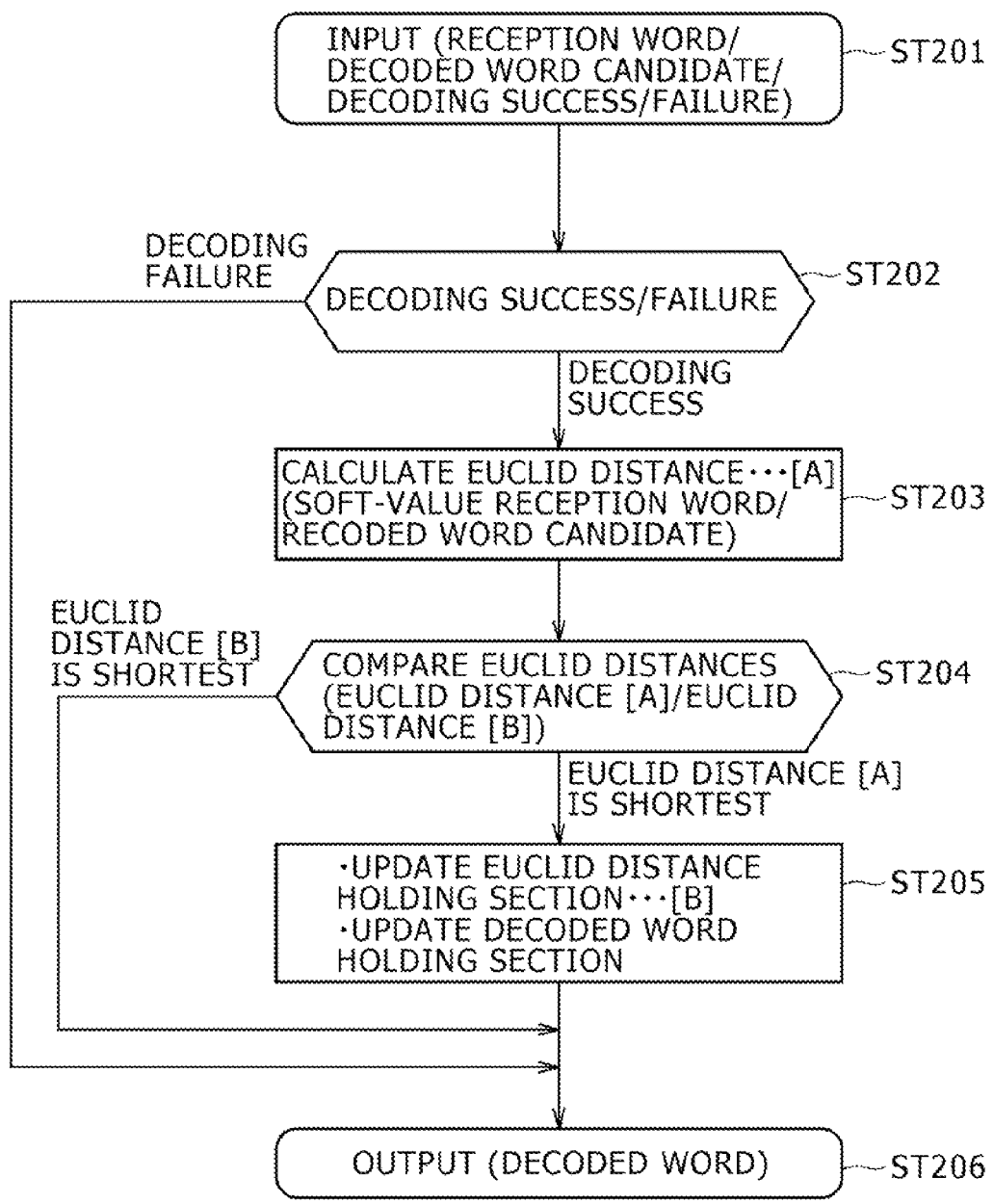
FIG. 5 is a flowchart illustrating a specific procedure performed by an MAP decoding section according to the present embodiment.

FIG. 5 is a flowchart illustrating a specific procedure performed by the MAP decoding section 204 according to the present embodiment.

Upon input of the one or more decoded word candidates D203 and decoding success/failure D204 and the soft-decided reception word D205 supplied from the soft-value reception value holding section 203 (ST201), the MAP decoding section 204 calculates, if the decoding success/failure D204 indicates decoding success (ST202), a Euclid distance between the soft-decided reception word D205 and the decoded word candidate D203 (ST203).

If the Euclid distance calculated is shorter than any other Euclid distance previously calculated (ST204), the MAP decoding section 204 updates and holds the Euclid distance (ST205).

After the above process is performed one or more times, a decoded word candidate that is held at the end is outputted as the decoded word D206 (ST206).

In the case where the decoding success/failure D204 indicates decoding failure, the corresponding decoded word candidate is excluded from the decoded word candidates and is not subjected to MAP decoding (ST202).

Next, an operation of the apparatus as illustrated in FIG. 4 will now be described below.

The reception word D201 received via the communications channel (not shown) is inputted to the ABP iterative decoding section 201 and the soft-value reception value holding section 203.

In the ABP iterative decoding section 201, the input reception word D201 is decoded in accordance with the technique using ABP, and the plurality of LLRs D202 updated sequentially by iterative decoding at this time are outputted to the bounded distance decoding section 202.

In the soft-value reception value holding section 203, the result obtained by subjecting the supplied reception word D201 to soft decision is held until the decoded word candidate D203 is outputted from the bounded distance decoding section 202. Then, the soft-decided reception word D205 is outputted to the MAP decoding section 204 when MAP decoding is performed in conjunction with the decoded word candidate D203.

In the bounded distance decoding section 202, the hard-decided LLR D202 supplied from the ABP iterative decoding section 201 is subjected to bounded distance decoding, and the resulting bounded distance decoding result D203 and the decoding success/failure D204 are outputted to the MAP decoding section 204.

Then, in the MAP decoding section 204, based on the one or more decoded word candidates D203 and decoding success/failure D204 and the soft-decided reception word D205 supplied from the soft-value reception value holding section 203, one decoded word D206 is selected from the decoded word candidates D203, and the selected decoded word D206 is outputted.

Specifically, in the MAP decoding section 204, when the decoding success/failure D204 indicates decoding success, the Euclid distance between the soft-decided reception word D205 and the decoded word candidate D203 is calculated. Then, if the Euclid distance calculated is shorter than any other Euclid distance previously calculated, the Euclid distance is updated and held. Then, the decoded word candidate that is held at the end is outputted as the decoded word D206.

As described above, in the decoding apparatus according to the present embodiment, when a certain part of the transmission word is a known value, this known information is used so that a decoded word candidate in which the known part has been changed to another value, i.e., an erroneous decoded word, is excluded from the decoded word candidates. This results in improved decoding performance compared to when the known information is not used.

Note that in the embodiment described above, the decoding apparatus decodes the Reed-Solomon code. It will be appreciated, however, that the code to be decoded by the decoding apparatus is not limited to the Reed-Solomon code, but may be the BCH code or other types of codes in accordance with other encoding schemes. Also note that when decoding the LLRs obtained by the ABP iterative decoding to obtain the list of the decoded word candidates, K-V list decoding, soft-decision list decoding using a soft value as it is as an input, and so on are applicable as well as the bounded distance decoding after hard decision.

FIG. 6 shows another specific example in which the decoding method according to one embodiment of the present invention is applied to an ABP iterative decoder (circuit).

A decoding apparatus 200A as illustrated in FIG. 6 is different from the decoding apparatus 200 of FIG. 4 in that a known information success/failure determination section 205 is provided between output of the bounded distance decoding section 202 and input of the MAP decoding section 204.

The known information success/failure determination section 205 accepts the bounded distance decoding result D203 and the decoding success/failure D204 as inputs, and outputs a decoded word candidate D207 and decoding success/failure D208 to the MAP decoding section 204.

The known information success/failure determination section 205 checks whether a certain part of the bounded distance decoding result D203 is a known value. If the certain part of the bounded distance decoding result D203 is a known value, the known information success/failure determination section 205 outputs the input decoding success/failure D204 as it is as the decoding success/failure D208. Meanwhile, if the certain part of the bounded distance decoding result D203 is not a known value, the known information success/failure determination section 205 outputs decoding failure as the decoding success/failure D208. Note that, in this case, regardless of known information success/failure, the input bounded distance decoding result D203 as it is is outputted as the decoded word candidate D207.

In the decoding apparatus 200A of FIG. 6 also, when a certain part of the transmission word is a known value, this known information is used so that a decoded word candidate in which the known part has been changed to another value, i.e., an erroneous decoded word, is excluded from the decoded word candidates. This results in improved decoding performance compared to when the known information is not used.

Note that the decoding method described above in detail can be implemented as a program corresponding to the above-described procedure, and that such a program can be executed by a computer such as a CPU.

Also note that such a program can be stored in a storage medium such as a semiconductor memory, a magnetic disk, an optical disk, or a floppy (registered trademark) disk, and that a computer for which the storage medium is prepared can access and execute the program.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding method of performing maximum a posteriori probability decoding of selecting one decoded word from one or more decoded word candidates obtained by subjecting a linear code to iterative decoding by comparison of distances between a reception word and each decoded word candidate, wherein
    a decoded word candidate in which a known value in a part of a transmission word has been changed to another value is excluded from the one or more decoded word candidates.

2. The decoding method according to claim 1, wherein a value of a synchronization byte of a transport stream packet or an inverse of the value of the synchronization byte is used as the known value in the part of the transmission word.

3. The decoding method according to claim 1, wherein an algebraic geometric code is used as the linear code.

4. The decoding method according to claim 3, wherein when comparing the distances between the reception word and each decoded word candidate in MAP decoding, a decoded word candidate whose Euclid distance from the reception word is shortest is selected as the decoded word.

5. The decoding method according to claim 1, wherein the one or more decoded word candidates are obtained using bounded distance decoding, with reliability obtained by iterative decoding using adaptive belief propagation as an input.

6. A decoding apparatus, comprising:
    a candidate acquisition section configured to acquire one or more decoded word candidates obtained by subjecting a linear code to iterative decoding; and
    a decoding section configured to perform maximum a posteriori probability decoding of selecting one decoded word from the one or more decoded word candidates by comparison of distances between a reception word and each decoded word candidate, wherein
    a decoded word candidate in which a known value in a part of a transmission word has been changed to another value is excluded from the one or more decoded word candidates.

7. The decoding apparatus according to claim 6, wherein a value of a synchronization byte of a transport stream packet or an inverse of the value of the synchronization byte is used as the known value in the part of the transmission word.

8. The decoding apparatus according to claim 6, wherein an algebraic geometric code is used as the linear code.

9. The decoding apparatus according to claim 8, wherein said decoding section selects, as the decoded word, a decoded word candidate whose Euclid distance from the reception word is shortest when comparing the distances between the reception word and each decoded word candidate in maximum a posteriori probability decoding.

10. The decoding apparatus according to claim 6, wherein said candidate acquisition section acquires the one or more decoded word candidates using bounded distance decoding, with reliability obtained by iterative decoding using adaptive belief propagation (ABP) as an input.

11. A decoding apparatus, comprising:
   candidate acquisition means for acquiring one or more decoded word candidates obtained by subjecting a linear code to iterative decoding; and
   decoding means for performing maximum a posteriori probability decoding of selecting one decoded word from the one or more decoded word candidates by comparison of distances between a reception word and each decoded word candidate, wherein
   a decoded word candidate in which a known value in a part of a transmission word has been changed to another value is excluded from the one or more decoded word candidates.

* * * * *